United States Patent
Han

(10) Patent No.: US 7,696,019 B2
(45) Date of Patent: Apr. 13, 2010

(54) SEMICONDUCTOR DEVICES AND METHODS OF MANUFACTURING THEREOF

(75) Inventor: Jin-Ping Han, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 272 days.

(21) Appl. No.: 11/371,544

(22) Filed: Mar. 9, 2006

(65) Prior Publication Data

US 2007/0210301 A1 Sep. 13, 2007

(51) Int. Cl.
*H01L 21/00* (2006.01)

(52) U.S. Cl. .......................... 438/149; 438/41; 438/44; 438/269; 438/358; 438/360; 438/429; 438/300; 438/299; 438/301; 257/E21.092; 257/E21.09; 257/E21.097; 257/E21.158; 257/E21.461; 257/E21.476; 257/E21.562; 257/213; 257/E21.385; 257/E21.42; 257/E21.43

(58) Field of Classification Search .......... 257/E21.092, 257/E21.09, E21.097, E21.158, E21.461, 257/E21.476, E21.562; 438/41, 44, 269, 438/358, 149, 360, 429
See application file for complete search history.

(56) References Cited

U.S. PATENT DOCUMENTS

| | | | |
|---|---|---|---|
| 5,795,808 A * | 8/1998 | Park | 438/301 |
| 6,657,223 B1 * | 12/2003 | Wang et al. | 257/19 |
| 6,867,428 B1 * | 3/2005 | Besser et al. | 257/19 |
| 6,891,192 B2 * | 5/2005 | Chen et al. | 257/49 |
| 7,195,983 B2 * | 3/2007 | Chindalore et al. | 438/301 |
| 2005/0082522 A1 * | 4/2005 | Huang et al. | 257/19 |
| 2005/0285193 A1 * | 12/2005 | Lee et al. | 257/347 |
| 2006/0011990 A1 * | 1/2006 | Furukawa et al. | 257/377 |
| 2006/0084235 A1 * | 4/2006 | Barr et al. | 438/300 |
| 2006/0237746 A1 * | 10/2006 | Orlowski et al. | 257/192 |
| 2007/0190741 A1 * | 8/2007 | Lindsay | 438/424 |

* cited by examiner

*Primary Examiner*—N Drew Richards
*Assistant Examiner*—Ankush K Singal
(74) *Attorney, Agent, or Firm*—Slater & Matsil, L.L.P.

(57) ABSTRACT

Semiconductor devices and methods of manufacturing thereof are disclosed. A preferred embodiment includes a semiconductor device comprising a workpiece, the workpiece including a first region and a second region proximate the first region. A first material is disposed in the first region, and at least one region of a second material is disposed within the first material in the first region, the second material comprising a different material than the first material. The at least one region of the second material increases a first stress of the first region.

29 Claims, 5 Drawing Sheets

SEMICONDUCTOR DEVICES AND METHODS OF MANUFACTURING THEREOF

TECHNICAL FIELD

The present invention relates generally to the fabrication of semiconductor devices, and more particularly to increasing the stress of material layers of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). A transistor typically includes a gate dielectric disposed over a channel region, and a gate formed over the gate dielectric. A source region and a drain region are formed on either side of the channel region within a substrate or workpiece.

In complementary metal oxide semiconductor (CMOS) devices, both positive and negative channel devices are used in complementary configurations. The positive and negative channel devices of CMOS devices are typically referred to as p channel metal oxide semiconductor (PMOS) and n channel metal oxide semiconductor (NMOS) transistors. A PMOS transistor is formed in an n well (e.g., a well implanted with n type dopants) and an NMOS transistor is formed in a p well. A shallow trench isolation (STI) region is typically formed between the n well and p well of the PMOS transistor and the NMOS transistor, respectively.

In some transistor designs, it is desirable to introduce stress to the channel region to improve the transistor performance.

What are needed in the art are improved methods and structures for introducing stress in transistors and other semiconductor devices.

SUMMARY OF THE INVENTION

These and other problems are generally solved or circumvented, and technical advantages are generally achieved, by preferred embodiments of the present invention which provide novel methods of introducing stress to source and drain regions of transistors and to other regions of semiconductor devices.

In accordance with a preferred embodiment of the present invention, a semiconductor device includes a workpiece having a first region and a second region proximate the first region. A first material is disposed in the first region, and at least one region of a second material is disposed within the first material in the first region, the second material comprising a different material than the first material. The at least one region of the second material increases a first stress of the first region.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely implemented in a source and drain region of a transistor. The invention may also be applied, however, to other semiconductor applications where introducing stress to an adjacent region is desired.

Figure 1:
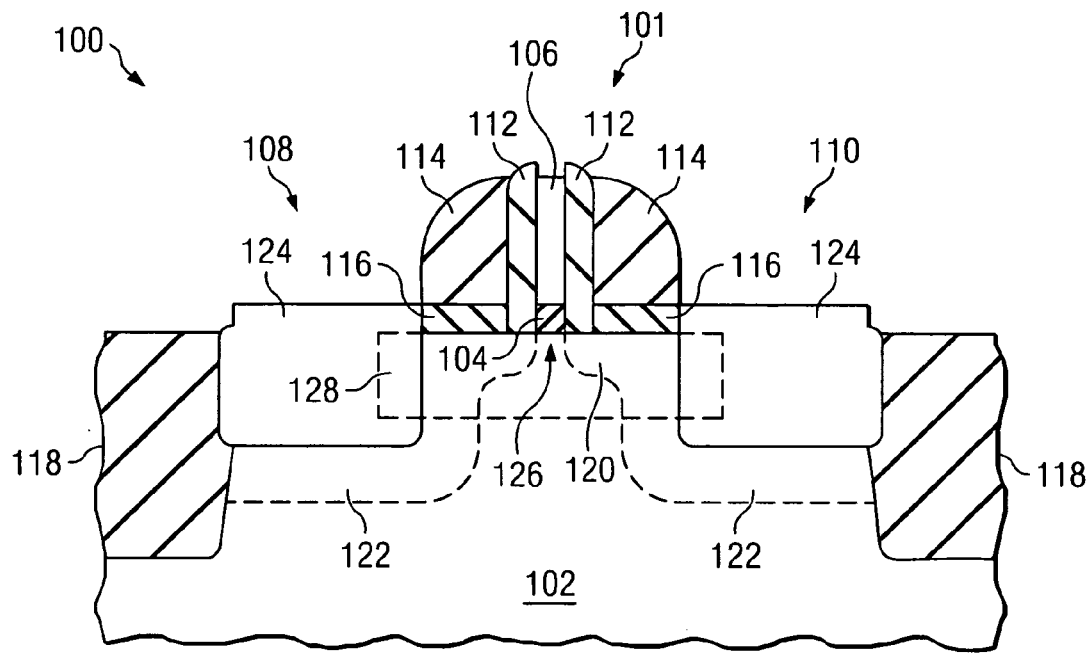
FIG. 1 shows a cross-sectional view of a prior art transistor having SiGe in the source and drain regions.

FIG. 1 shows a cross-sectional view of a prior art semiconductor device 100 including a transistor 101 having SiGe 124 formed in the source and drain regions 108 and 110. The transistor 101 is typically fabricated by providing a workpiece 102 and forming STI regions 118 in the workpiece. A gate dielectric material 104 is deposited over the workpiece 102, and a gate material 106 is deposited over the gate dielectric material 104. The gate material 106 and the gate dielectric material 104 are patterned using lithography to form a gate 106 and gate dielectric 104. The workpiece 102 is lightly doped with a dopant species to form lightly doped regions 120 in a top surface of the workpiece 102 proximate the gate 106 and gate dielectric 104.

Spacers 112/114/116 comprising insulating materials are formed on the sidewalls of the gate 106 and gate dielectric 104. The workpiece 102 may include a deep implantation of a dopant species proximate the spacers 112/114/116, as shown at 122. Exposed portions of the workpiece 102 are recessed using an etch process, and then SiGe 124 is epitaxially grown in the recesses to form the source region 108 and the drain region 110. A channel region 126 of the transistor 101 is located beneath the gate dielectric 104 between the source region 108 and the drain region 110.

Figure 2:
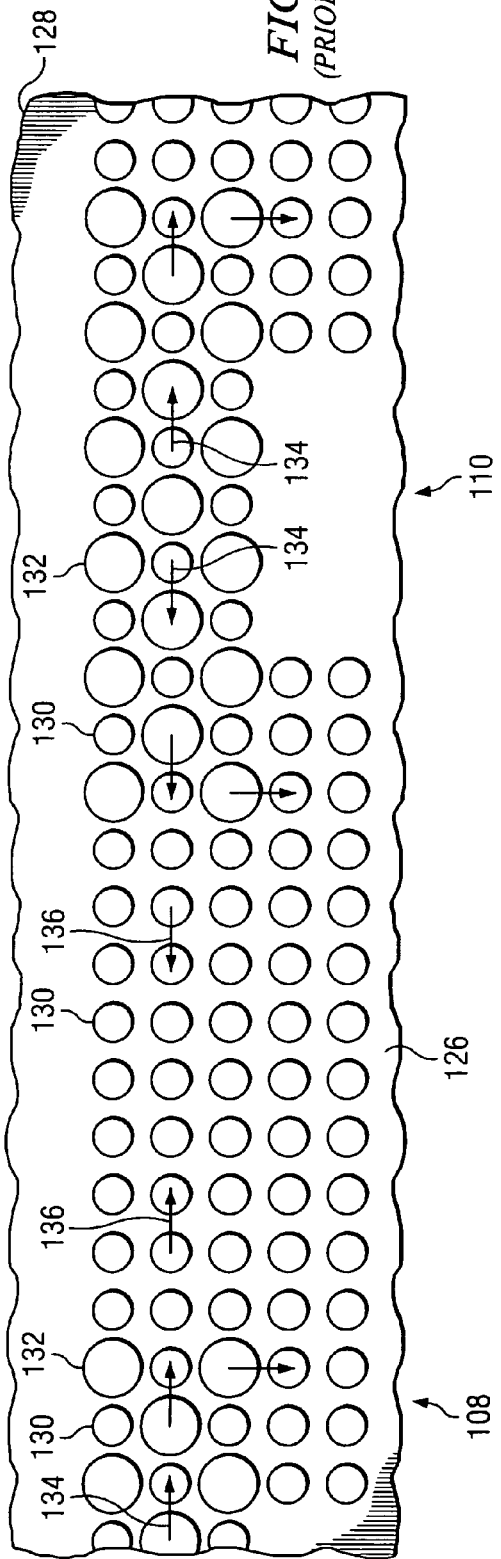
FIG. 2 shows a more detailed view of the channel region of the transistor shown in FIG. 1, illustrating the effect that the SiGe source and drain regions have on stress in the channel region of the transistor.

FIG. 2 shows a more detailed view of region 128 of the transistor 101 shown in FIG. 1, illustrating the effect that the SiGe 124 molecules in the source and drain regions 108 and 110 have on stress in the channel region 126 of the transistor 101. The channel region 126 comprises only silicon atoms 130, and the source and drain regions 108 and 110 comprise SiGe molecules comprised of silicon atoms 130 and germanium atoms 132. The germanium atoms 132 are larger than the silicon atoms 130, which creates tensile stress 134 in the source region 108 and the drain region 110, as shown. The tensile stress 134 in the source region 108 and the drain region 110 causes compressive stress 136 in the channel region 126 which is surrounded on either side by and adjacent to the source region 108 and drain region 110.

Introducing stress to the channel region 126 of a transistor 101 is advantageous in some applications, because the performance of the transistor 101 may be improved. For example, forming epitaxially grown SiGe in CMOS technology in PMOS field effect transistors (FET's) has demonstrated performance enhancement by introducing stress to the channel region. However, SiGe in the source and drain regions of transistors has exhibited stress relaxation, e.g., over time or after various anneal processes and other processing steps used to manufacture the transistors.

Thus, what are needed in the art are improved methods and structures for introducing stress to source, drain, and channel regions of transistors, and to various regions of semiconductor devices.

Embodiments of the present invention provide novel structures and methods of introducing stress to source and drain regions of transistors, which creates stress in the channel region. Embodiments of the invention may also be implemented in other applications where introducing stress to an adjacent region is desired.

Figure 3:
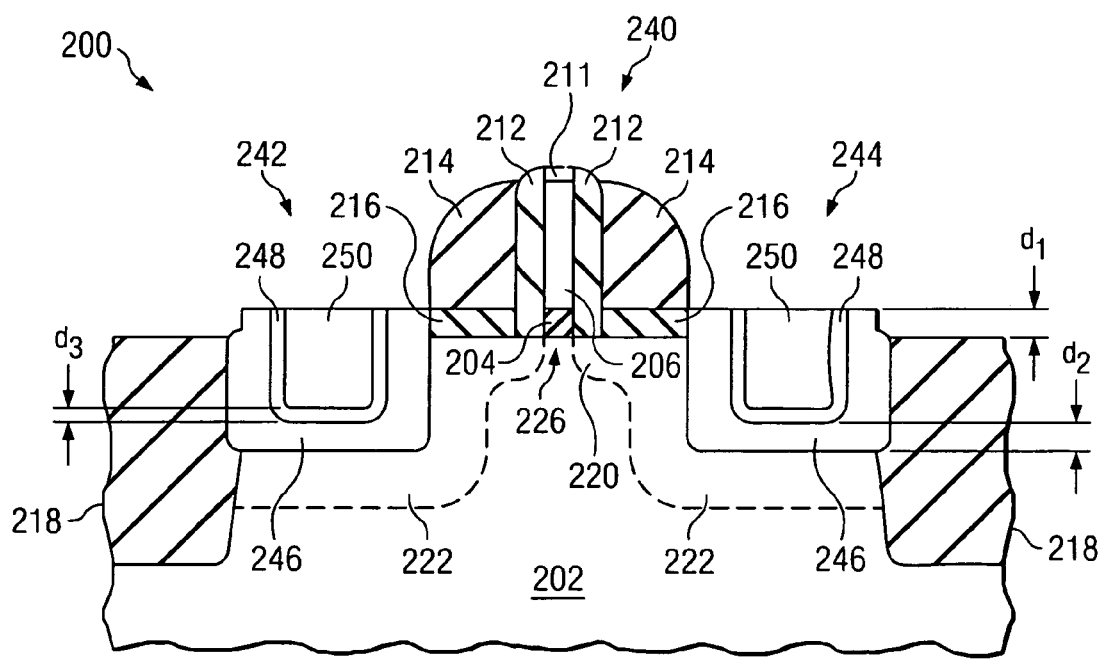
FIG. 3 is a cross-sectional view of an embodiment of the present invention, wherein the source and drain regions of a transistor comprise a first portion of a first material, a second material disposed over the first portion of the first material, and a second portion of the first material disposed over the second material.

FIG. 3 shows a cross-sectional view of a preferred embodiment of the present invention, wherein the source and drain regions 242 and 244 of a transistor 240 comprise a first portion 246 of a first material, a second material 248 disposed over the first portion 246 of the first material, and a second portion 250 of the first material disposed over the second material 248. Like numerals are used for the various elements in FIG. 3 that were used with reference to FIGS. 1 and 2. The first material (e.g., portions 246 and 250 of the first material) comprises a first stress-increasing material such as SiGe, and the second material 248 comprises a second stress-increasing material having molecules that are a different size than the molecules of the first material.

In some embodiments, the molecules of the second material 248 are larger than the molecules of the first material, so that the second material 248 increases the tensile stress of the source and drain regions 242 and 244. The increased tensile stress of the source and drain regions 242 and 244 increases the compressive stress in the channel region 226. The second material 248 comprises an insertion layer disposed within the first material 246/250 that is deposited, epitaxially grown, or implanted.

The second material 248 preferably comprises at least one region of material formed within the first material 246/250, and the second material 248 may comprise a variety of shapes. For example, the at least one region of the second material 248 may comprise a structure comprising a vertically-extending fin or plug disposed partially or completely through the source region and the drain region; a horizontally-extending fin or plug disposed partially or completely through the source region and the drain region; a liner disposed over a first portion of the first material disposed within the workpiece, wherein a second portion of the first material is disposed over the liner; or combinations thereof, which will be further described herein with references to FIGS. 3, 4, and 6 through 10. Alternatively, the second material 248 may comprise other shapes, for example.

Referring to FIG. 3, a preferred method of fabricating a transistor 240 will next be described, wherein the second material 248 comprises a liner disposed over a first portion 246 of the first material disposed within the workpiece 202, and wherein a second portion 250 of the first material is disposed over the liner 248. First, a workpiece 202 is provided. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, or SiC, as examples, may be used in place of silicon, as examples. The workpiece 202 may comprise a silicon-on-insulator (SOI) substrate, for example.

STI regions 218 may be formed in the workpiece, e.g., by patterning the workpiece 202 using lithography, e.g., by depositing a layer of photoresist over the workpiece 202, patterning the layer of photoresist using a lithography mask, removing portions of the layer of photoresist, and using the layer of photoresist as a mask while exposed portions of the workpiece 202 are etched away using an etch process. The patterned portions of the workpiece 202 are filled with an insulating material such as silicon dioxide to form STI regions 218. The STI regions 218 are preferably formed before the formation of the transistor 240 in some embodiments, although alternatively, the STI region 218 may be formed after the transistor 240 is formed. In some applications, STI regions 218 may not be required, for example, not shown.

A gate dielectric material 204 comprising an insulator such as silicon dioxide, silicon nitride, or a low or high dielectric constant (k) material, or other insulating material is deposited over the workpiece 202, and a gate material 206 is deposited over the gate dielectric material 204. The gate dielectric material 204 may comprise a thickness of about 30 to 250 Angstroms, as an example, although alternatively, the gate dielectric material 204 may comprise other dimensions. The gate material 206 preferably comprises a semiconductor material such as silicon or polysilicon, as examples, although other semiconductor materials and conductors may also be used. The gate material 206 may comprise a thickness of about 1,000 to 2,000 Angstroms, as an example, although alternatively, the gate material 206 may comprise other dimensions. The gate material 206 and the gate dielectric material 204 are patterned using lithography to form a gate 206 and gate dielectric 204. The gate 206 is also referred to herein as a gate electrode.

Optionally, exposed portions of the workpiece 202 may be lightly doped with a dopant species to form lightly doped regions 220 proximate the gate 206 and gate dielectric 204 within an upper portion of the workpiece 202, as shown. A spacer 212/214/216 comprising insulating materials are formed on the sidewalls of the gate 206 and gate dielectric 204. The spacer 212/214/216 may comprise one or more layers of silicon oxide or silicon nitride, as examples, although alternatively, other materials may also be used.

For example, the spacer 212/214/216 may comprise a liner 216/212 comprising silicon nitride or silicon oxide that is substantially conformal and covers all exposed surfaces. The spacer 212/214/216 may include an insulating material 214 formed over the liner 216/212 that comprises silicon oxide or silicon nitride. The insulating material 214 may comprise a different material than the liner 216/212, for example. The insulating material 214 and liner 216/212 may be patterned and/or etched, e.g., using an anisotropic etch process to form downwardly sloping sidewalls on the insulating material 214, as shown. A small portion of an insulating material 211, e.g., comprising a portion of the liner 216/212, shown in phantom, is preferably left disposed over the top surface of the gate 206 and removed later in the manufacturing process. The insulating material 211 over the gate 206 may comprise a thickness of about 100 to 600 Angstroms, for example, although alternatively, the insulating material 211 may comprise other dimensions.

After the formation of the sidewall spacers 212/214/216, optionally, the workpiece 202 may be implanted with a deep implantation of a dopant species, as shown at 222, in the source region 242 and the drain region 244 proximate the spacer 212/214/216.

Next, in accordance with a preferred embodiment of the present invention, exposed portions of the workpiece 202 are recessed using an etch process. A first recess is formed in the source region 242 and a second recess is formed in the drain region 244. The first recess and the second recess preferably comprise a depth beneath the top surface of the workpiece 202 of about 80 to 110 nm, and more preferably comprises a depth of about 200 nm or less, for example. Alternatively, the amount of the recesses may comprise other dimensions.

The first recess and the second recess may comprise a substantially square or rectangular shape within the workpiece 202, as shown, in some embodiments. In other embodiments, the first recess and the second recess may comprise a round shape, an oval shape, or undercut in a symmetric or skewed shape (e.g., being wider at the bottom than at the top of the recesses), not shown.

A first portion 246 of a first material is formed in the first recess and the second recess to partially fill the first recess and the second recess. The first portion 246 of the first material is preferably formed by epitaxial growth, e.g., by exposing the recessed portions of the workpiece 202 to a gas containing the material to be grown epitaxially, which preferably comprises SiGe in one embodiment, for example. In other embodiments, the first portion 246 of the first material may be deposited, using atomic layer deposition (ALD), physical vapor deposition (PVD), chemical vapor deposition (CVD), or other deposition methods, for example.

A second material 248 is formed over the first portion 246 of the first material, as shown in FIG. 3. The second material 248 is preferably epitaxially grown over the first portion 246 of the first material in some embodiments, although alternatively, the second material 248 may be deposited using ALD, PVD, CVD, or other deposition method, for example. The second material 248 preferably partially fills the first recess and the second recess of the source region 242 and the drain region 244, respectively.

A second portion 250 of the first material is formed over the second material 248 to fill the first recess and the second recess in the source region 242 and the drain region 244, as shown. The second portion 250 of the first material preferably comprises the same material as the first portion 246 of the first material, for example. The second portion 250 of the first material is preferably formed by epitaxial growth, and alternatively may be formed using ALD, PVD, CVD, or other deposition methods.

In a preferred embodiment, the first portion 246 of the first material, the second material 248, and the second portion 250 of the first material are formed epitaxially so that the materials only form in the recessed portion of the workpiece 202, e.g., on the exposed workpiece 202. Because they preferably comprise semiconductive materials, advantageously, the first material 246/250 and second material 248 will not epitaxially grow over the insulating materials of the STI regions 218, the spacer 212/214/216, or the spacer 211 on top of the gate 206. In other embodiments, however, the first portion 246 of the first material, the second material 248, and the second portion 250 of the first material may be deposited to cover the entire workpiece 202 and are later removed using lithography from undesired areas, such as over the STI regions 218, the spacer 212/214/216, or the spacer 211 on top of the gate 206, for example.

The first material (e.g., portions 246 and 250 of the first material) comprises a first stress-increasing material. The first material 246/250 preferably comprises a semiconductive material, and more preferably comprises SiGe in one embodiment, for example. Alternatively, the first material 246/250 may comprise other semiconductive materials.

The second material 248 comprises a second stress-increasing material. The second material 248 preferably comprises a semiconductive material that is different than the semiconductive material of the first material, for example. The second material 248 preferably comprises a material comprising molecules that have a different size than the molecules of the first material. The second material 248 preferably comprises Ge in one embodiment. Ge atoms are larger than Si atoms, and thus, inserting a layer of Ge atoms into a source region 242 and drain region 244 increases the stress, e.g., the tensile stress of the source region 242 and the drain region 244. The increased tensile stress of the source and drain regions 242 and 244 causes an increase in the compressive stress of the channel region 226 adjacent the source and drain regions 242 and 244 of the transistor 240.

The second material 248 may also comprise other semiconductive materials having different sized molecules and/or atoms than the molecules and/or atoms of the first material 246/250. For example, the second material 248 may alternatively comprise InAs, InSb, InP, or Si or other materials, which comprise molecules that are larger than atoms of the first material 246/250. In some embodiments, the second material 248 may comprise Si having a different crystalline orientation than Si of the workpiece 202, as an example, or having a different crystalline orientation than the crystalline orientation of the first portion of the first material 246. For example, the second material 248 may comprise Si having a crystalline orientation of <110>, <111>, or other orientations. In other embodiments, the second material 248 may comprise other semiconductive materials such as Ge, InAs, InSb, or InP having a different crystalline orientation than the crystalline orientation of the first portion of the first material 246, or a different crystalline orientation than the crystalline orientation of the silicon of the workpiece 202.

If the second material 248 comprises InAs or InSb, as examples, the InAs and InSb have a smaller band gap than SiGe and thus result in a reduction in the contact resistance of the source and drain regions 242 and 244, for example, which is an advantage in some applications.

Embodiments of the present invention wherein the second material 248 comprises molecules or atoms that are larger than the molecules or atoms of the first material 246/250 are particularly advantageous when implemented in the source region 242 and drain region 244 of a PMOS FET, for example, because the second material 248 increases the tensile stress of the source region 242 and drain region 244, which causes an increase in the compressive stress in the channel region 246. An increased compressive stress in the channel region 246 results in improved performance of a PMOS FET transistor 240, for example.

However, in other embodiments, the second material 248 preferably comprises molecules or atoms that are smaller than the molecules or atoms of the first material 246/250. This is particularly advantageous when implemented in the source region 242 and drain region 244 of an NMOS FET, for example, because the second material 248 increases the compressive stress of the source region 242 and drain region 244, which causes an increase in the tensile stress in the channel region 246. An increased tensile stress in the channel region 246 results in improved performance of an NMOS FET transistor 240, for example. In this embodiment, the first material 246/250 preferably comprises SiC, which may be epitaxially grown, for example, or deposited, as previously described herein, and the second material 248 preferably comprises C or other elements comprising smaller atoms and/or molecules than SiC, for example.

In one embodiment, the second material 248 may be formed within the first material 246/250 by implantation. In this embodiment, the first material 246/250 comprises a single material layer that is epitaxially grown or deposited in the first recess and the second recess of the source region 242 and the drain region 244, respectively. The second material 248 is then implanted into the first material 246/250 using an implantation process. The dose and amount of the implantation process is preferably adjusted to achieve the desired depth and shape of the second material 248 within the first material 246/250.

The first material 246/250 and the second material 248 are preferably formed within the first recess and the second recess in the source region 242 and drain region 244 to at least fill the first recess and the second recess. Preferably, in some embodiments, the first material 246/250 and the second material 248 extend above the top surface of the workpiece 202 by an amount $d_1$, as shown in FIG. 3. The dimension $d_1$ preferably comprises about 0 to 100 nm, and the dimension $d_1$ may comprise about ½ of the depth of the first and second recess within the workpiece 202 in some embodiments, as examples.

The first portion 246 of the first material preferably comprises a thickness of about 50 nm or less, although alternatively, the first portion 246 may comprise other dimensions, e.g., such as about 100 nm or less, as shown at dimension $d_2$. The second material 248 preferably comprises a thickness of about 50 nm, for example, and more preferably comprises a thickness of about 20 nm or greater in some embodiments, for example, as shown at dimension $d_3$. In the embodiment of the present invention shown, the second material 248 comprises a liner having substantially the same shape as the recess in the source and drain regions 242 and 244, and the second material 248 is spaced apart from the recessed workpiece 202 by the thickness of the first portion 246 of the first material.

Figure 10:
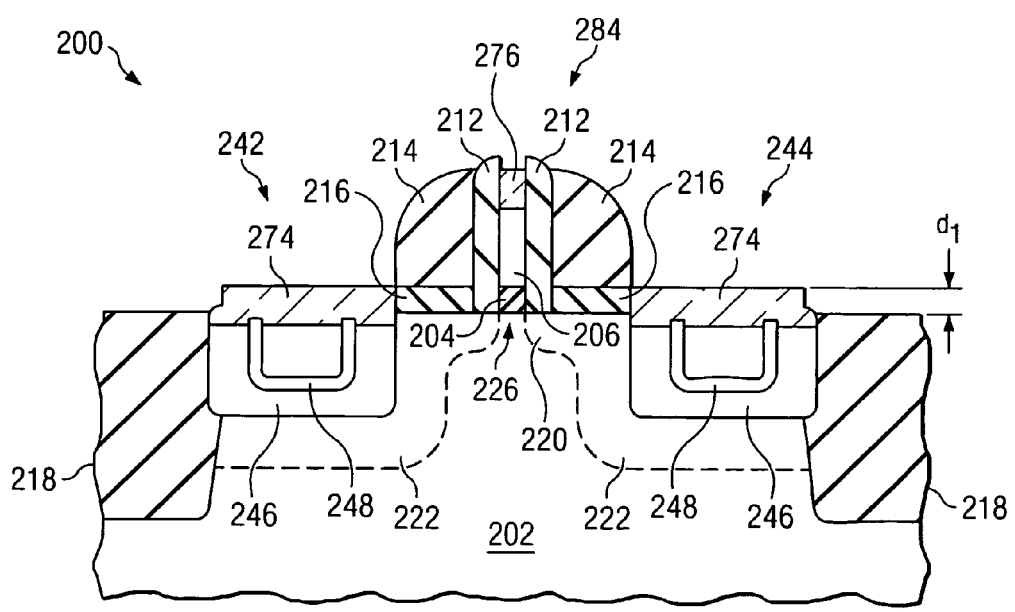
FIG. 10 shows an embodiment of the present invention, wherein the source region, the drain region, and the gate of a transistor have a silicide formed at a top surface thereof.

After the formation of the source region 242 and the drain region 244, the portion of the spacer 211 residing on top of the gate 206 is removed, and the source region 242, the drain region 244, and the gate 206 may be silicided, as shown in FIG. 10, to be described further herein. Insulating materials and conductive materials may be formed over the transistor 240 and patterned to make electrical contact to portions of the transistor 240, not shown, and the manufacturing process is continued to complete the semiconductor device 200, not shown.

Figure 4:
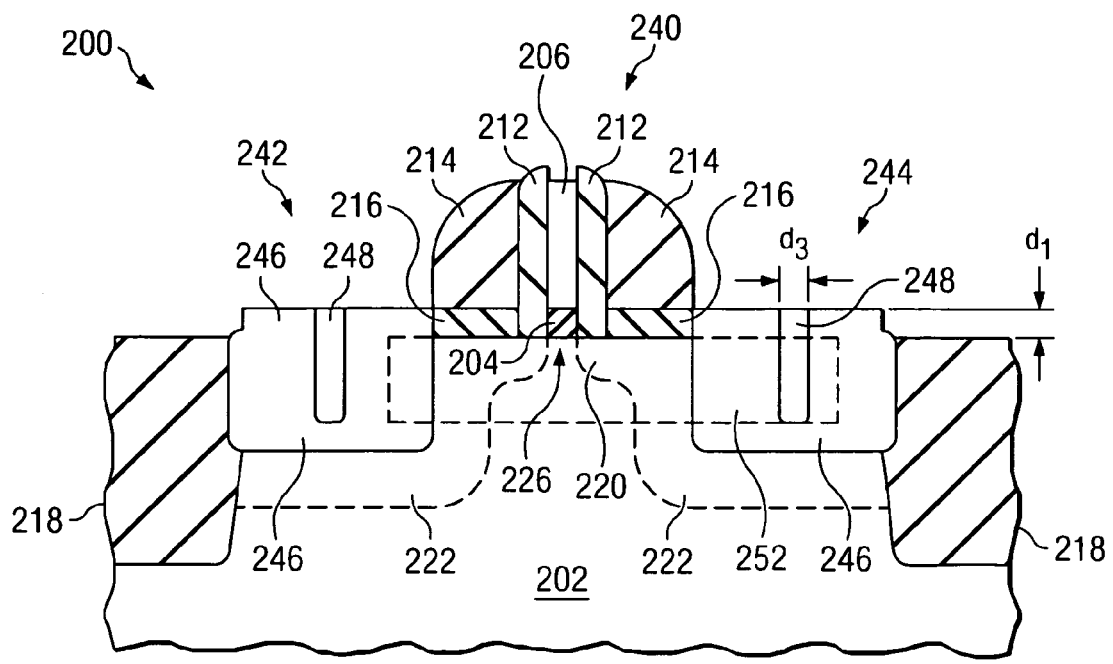
FIG. 4 is a cross-sectional view of another embodiment of the present invention, wherein the source and drain regions of a transistor comprise a first material epitaxially grown or deposited over recesses in a workpiece, and a second material disposed over the first material to fill the recesses in the workpiece.

FIG. 4 is a cross-sectional view of another embodiment of the present invention, wherein only one portion 246 of the first material is formed in the source and drain regions 242 and 244 of a transistor 240. The first portion 246 of the first material is also referred to herein as the first material 246, for example. The first material 246 may be epitaxially grown or deposited over recesses in the workpiece 202 as described with reference to FIG. 3, to partially fill the recesses. Then, a second material 248 may be epitaxially grown or deposited over the first material 246 to substantially completely fill the recesses, as shown in FIG. 4. Alternatively, the first material 246 may be grown or deposited to substantially completely fill the recesses, and the second material 248 may be implanted into the first material 246, for example.

Note that the spacer 211 on top of the gate 206 is not shown in FIGS. 4, 6, 7, and 10, although preferably, the spacer 211 is left remaining on top of the gate 206 during the formation of the source and drain regions 242 and 244 in accordance with preferred embodiments of the present invention.

In the embodiment shown in FIG. 4, the second material 248 preferably comprises a single vertically-extending fin or plug disposed partially through the source region 242 and the drain region 244. For example, the second material 248 may comprise a plug having substantially the same dimension extending into and out of the paper as the dimension $d_3$ illustrated from the left side to the right side of the second material 248 in FIG. 4. For example, the second material 248 may have a width $d_3$ of about 50 nm and a length (in and out of the paper) of about 50 nm.

Alternatively, the second material 248 may comprise a fin having a larger dimension extending into and out of the paper as the dimension illustrated from the left side to the right side of the second material 248 in FIG. 4. For example, the second material 248 may have a width $d_3$ of about 50 nm and a length (in and out of the paper) of greater than 50 nm, e.g., 100 nm to several μm. The second material 248 may extend the entire length of the channel region 226 of the transistor 240, for example.

The plug or fin of the second material 248 preferably extends from a top surface of the workpiece to a point at least past the channel region 226 of the transistor 240, for example, in some embodiments.

Figure 5:
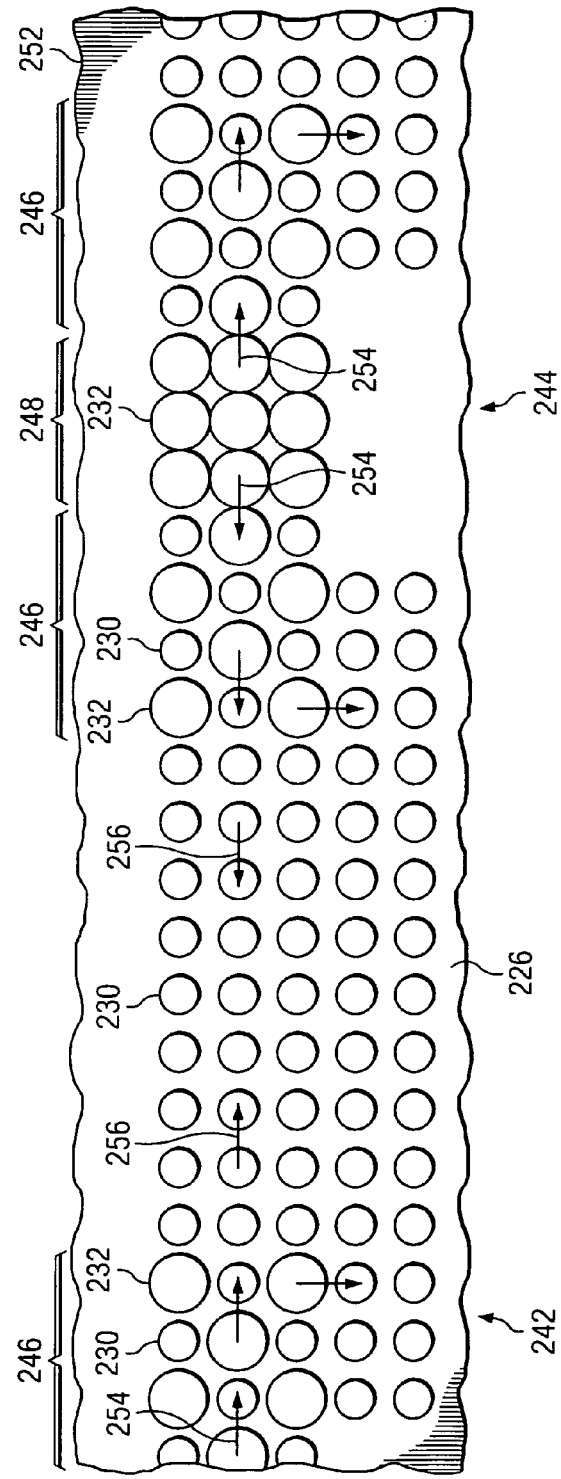
FIG. 5 shows a more detailed view of the channel region of the transistor shown in FIG. 4, illustrating the effect that the first material and second material of the novel source and drain regions of embodiments of the present invention have on stress in the channel region of the transistor.

FIG. 5 shows a more detailed view of the channel region of the transistor 240 shown in FIG. 4, illustrating the effect that the first material 246 and second material 248 of the source and drain regions 242 and 244 have on the stress 256 of the material in the channel region 226 of the transistor 240. A more detailed view of region 252 of the transistor 240 in FIG. 4 is shown in FIG. 5. An example of a second material 248 comprising Ge is illustrated in FIG. 4.

The first material 246 in the source region 242 and the drain region 244 comprise silicon atoms 230 and germanium atoms 232, wherein the germanium atoms 232 are larger than the silicon atoms 230. The Ge atoms 232 of the second material 248 are larger than the silicon atoms 230 of the first material 236 and thus increase the tensile stress 254 of the source region 242 and the drain region 244. The increased tensile stress 254 causes an increase in the compressive stress 256 in the channel region 226, as shown. Preferably, in accordance with embodiments of the present invention, a desired stress for a channel region 226 may be achieved by selecting the appropriate second material 248 material type, thickness, and method of formation of the second material 248, for example.

Alternatively, the second material 248 may comprise atoms that are smaller than Si atoms 230, for example, such as C, and the first material 246 may comprise SiC. The second material 248 causes an increase in the compressive stress in the source and drain regions 242 and 244 in this embodiment, which causes an increase in the tensile stress in the channel region 226, for example. The second material 248 may also comprise a material having a different crystalline orientation than the first material 246 and/or workpiece 202, for example.

Figure 6:
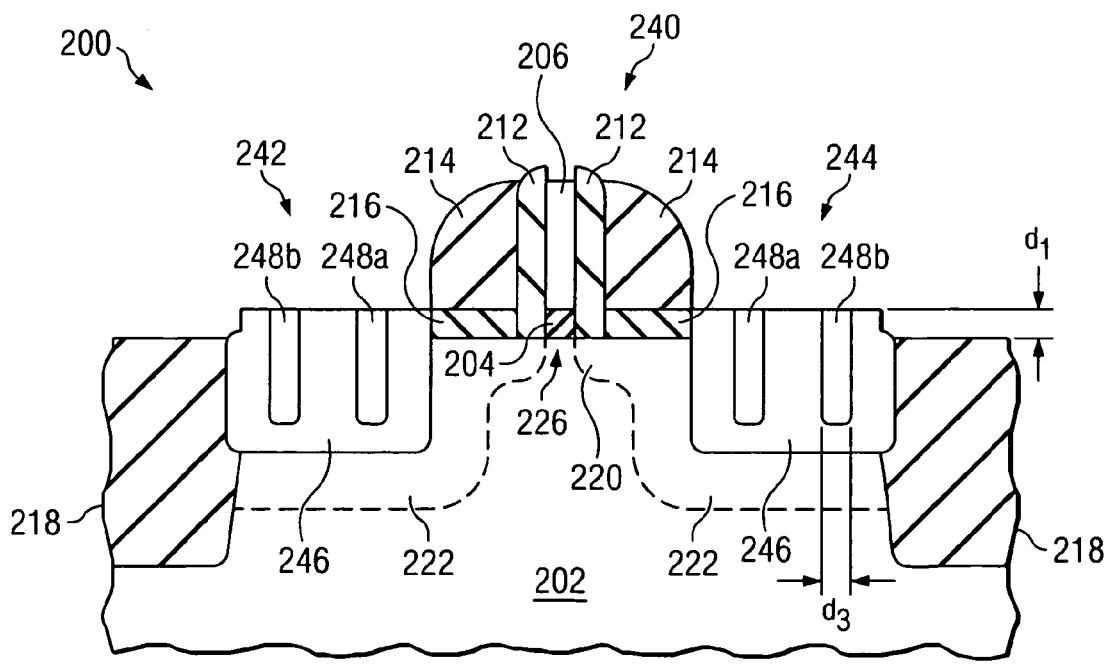
FIG. 6 shows a cross-sectional view of another embodiment of the present invention, wherein a plurality of regions of the second material are disposed within the first material in the source and drain regions of a transistor.

FIG. 6 shows a cross-sectional view of another embodiment of the present invention, wherein a plurality of regions of second material 248 are disposed within the first material 246 in the source and drain regions 242 and 244 of a transistor 240. Two regions 248a and 248b of second material 248 are shown, although alternatively, there may be two or more regions of the second material 248 formed. Each region of the second material 248 may comprise a structure comprising a vertically-extending fin or plug disposed partially through the source region 242 and the drain region 244 in this embodiment, for example. The source and drain regions 242 and 244 may be formed using epitaxial growth, deposition, or implantation, or combinations thereof, as examples.

The first material 246 may be formed by epitaxial growth or deposition, and the first material 246 may be patterned using lithography to form at least one recess in the first material 246, for example. The second material 250 may be formed by epitaxially growing or depositing the second material 250 in the at least one recess in the first material 246, for example.

Figure 7:
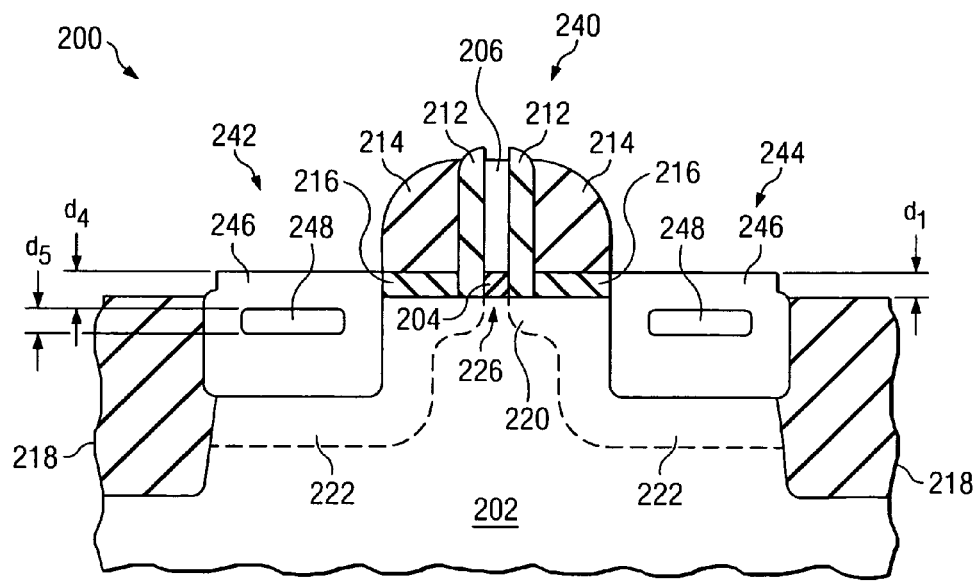
FIG. 7 shows a cross-sectional view of yet another embodiment of the present invention, wherein the second material is formed within the first material in the source and drain regions proximate the channel region of a transistor.

FIG. 7 shows a cross-sectional view of yet another embodiment of the present invention, wherein the second material 248 is formed within the first material 246 in the source and drain regions 242 and 244 proximate the channel region 226 of a transistor 240. In this embodiment, the second material 248 may comprise a structure comprising at least one (although only one is shown in FIG. 7) horizontally-extending fin or plug disposed partially (as shown) or completely through the source region 242 and the drain region 244. The second material 248 is preferably formed by implantation in this embodiment, e.g., the second material 248 is preferably implanted below the top surface of the first material 246 by a predetermined amount $d_4$. The dimension $d_4$ may comprise about 10 nm or greater, as an example. In some embodiments, the second material 248 is preferably formed proximate the channel region 226, as shown. The horizontally-positioned second material 248 may comprise a thickness or dimension $d_5$ of about 50 nm or greater, and may comprise substantially the same thickness as the channel region 226, for example. Alternatively, dimension $d_4$ and $d_5$ may comprise other dimensions, for example.

Figure 8:
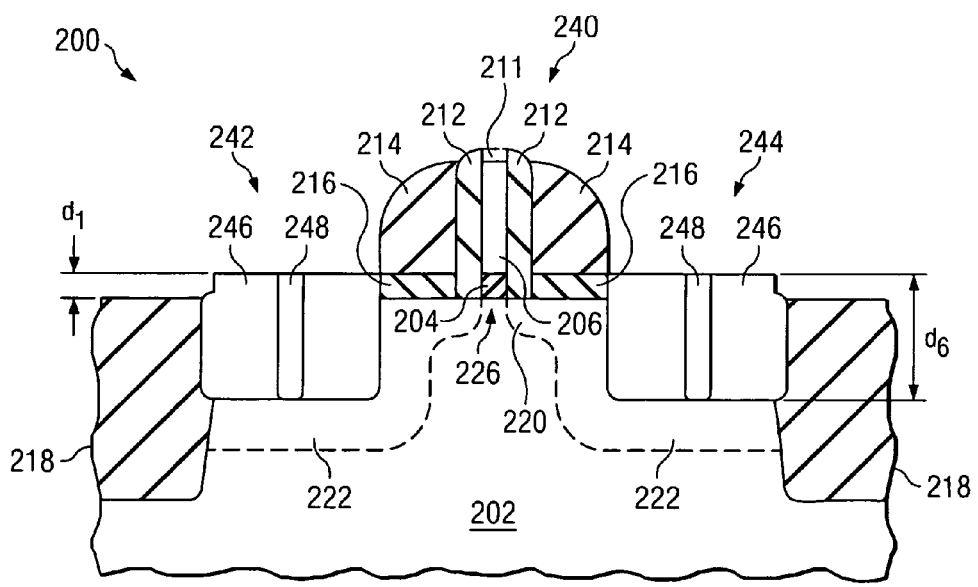
FIG. 8 shows a cross-sectional view of another embodiment of the present invention, wherein the second material is formed in the entire thickness of the first material in the source and drain regions of a transistor.

FIG. 8 shows a cross-sectional view of another embodiment of the present invention, wherein the second material 248 is formed in the entire thickness $d_6$ of the first material 246 in the source and drain regions 242 and 244 of a transistor 240. For example, the second material 248 may comprise at least one region of second material 248 comprising a vertically-extending fin or plug disposed completely through the source region 242 and the drain region 244, as shown.

The insulating liner 211 is shown in phantom in FIG. 8. The liner 211 on the top surface of the gate 206 is preferably removed so that the gate 206 will be silicided in a later manufacturing step. The insulating liner 211 protects the gate 206 during the manufacturing processes to form the first material 246/250 and the second material 248 in some embodiments. However, in the embodiment shown in FIG. 9, the liner 211 is removed before the recesses in the source region 242 and the drain region 244 are filled with the first material 246/250 and the second material 248, for example.

Figure 9:
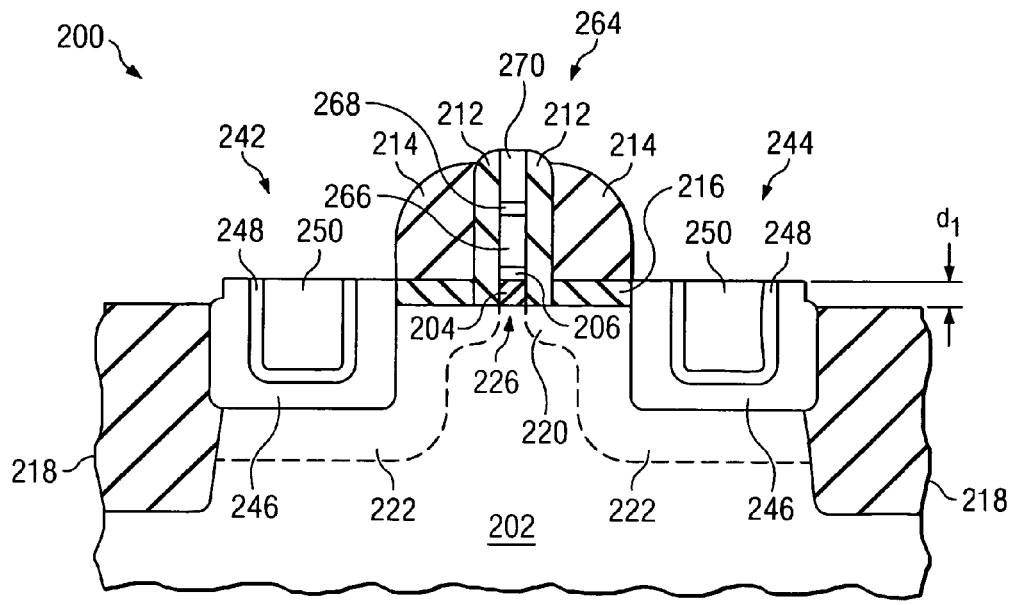
FIG. 9 shows an embodiment of the present invention, wherein the gate of a transistor also includes the first material and the second material formed in the source and drain regions.

FIG. 9 shows the embodiment of the present invention shown in FIG. 3, wherein the gate of the transistor 264 also includes the first material 266/270 (shown as 246/250 in the source and drain regions 242 and 244) and the second material 268 (shown as 248 in the source and drain regions 242 and 244) formed in the source and drain regions 242 and 244. In this embodiment, before the first recess and the second recess are formed in the source region 242 and the drain region 244, respectively, an etch process or other removal process is used to remove the liner 211 (shown in FIGS. 3 and 8 in phantom) from over the gate 206. Then an etch process is used to form the first recess and the second recess in the workpiece 202.

Because the gate 206 material also comprises silicon or polysilicon, the gate 206 is also recessed during the formation of the recesses in the source and drain regions 242 and 244 in the workpiece 202, for example, as shown in FIG. 9. Preferably, a small amount of the gate 206 material is left remaining over the gate dielectric 204, so that the gate 206 will act as a seed for epitaxial growth of the first material 246, for example.

An epitaxial growth method is used to form the first portion 246 of the first material in the recesses of the workpiece 202, during which the first portion of the first material (represented by 266 in the gate region) is also epitaxially grown on the recessed gate 206 material. An epitaxial growth method is used to form the second material 248 over the first portion 246 of the first material, during which the second material (represented by 268 in the gate region) is also epitaxially grown on top of the first portion of the first material 266 in the gate region. An epitaxial growth method is used to form the second portion 250 of the first material in the recesses of the workpiece 202 and fill the recesses, during which the second portion of the first material (represented by 270 in the gate region) is also epitaxially grown on the second material 268 in the gate region.

Advantageously, the second material 268 in the gate region increases the stress of the gate 206/266/268/270, and improves the performance of the transistor 264, in some embodiments. For example, the first material 266/270 and the second material 268 in the gate region may reduce or eliminate a polysilicon depletion effect in the transistor 240. The gate in this embodiment comprises the gate material 206, first portion 266 of the first material, second material 268, and second portion 270 of the first material, for example.

FIG. 10 shows the embodiment of the present invention shown in FIG. 3, wherein the source region 242, the drain region 244, and the gate 206 of a transistor 284 have a silicide 274 and 276 formed at a top surface thereof. The silicide 274 and 276 may be formed by depositing a layer of metal (not shown) such as Ti, Co, Ni, or NiPt as examples, although other metals may also be used, and heating the workpiece 202, not shown. The metal from the layer of metal diffuses into the semiconductive material of the source and drain regions, e.g., into the first material 246/250 and the second material 248, and into the semiconductive material of the gate 206, e.g., into the gate 206 material, forming a silicide 274 and 276, respectively, at a top surface thereof. The silicide 274 over the second material 248 may be thinner over the first material 246/250, as shown. An optional thin layer of silicon comprising a thickness of a few Angstroms (not shown) may be formed on the top surface of the source region 242 and drain region 244 (e.g., over the first material 246/250 and second material 248), and the gate 206 before the silicide formation to facilitate the silicide 274 and 276 formation, for example.

The layer of metal is then removed from the semiconductor device 200. The silicide 274 and 276 improves the conductivity and reduces the resistance of the source region 242, the drain region 244, and the gate 206, for example. A silicide 274 and 276 may also be formed on the source, drain and gate regions of the embodiments shown in FIGS. 4, 6, 7, 8, and 9, for example, not shown.

In some embodiments, the first material 246 may include a dopant species such as boron, for example, although alternatively, other dopant species may be used, such as arsenic or phosphorous, as examples, although other dopant species may also be used. The semiconductor device 200 may be heated or annealed using an additional heating or anneal step, or in another heating or anneal step used to process another material layer, for example, which causes at least a portion of the dopant species from the first material 246 into the adjacent workpiece 202, which results in the formation of the doped regions 222. Thus, a deep implantation step to form the deep implantation regions 222 may be advantageously avoided or eliminated, in accordance with embodiments of the present invention, for example.

Embodiments of the present invention may be implemented in structures other than the transistors 240, 264, and 284 shown in the drawings. For example, the novel second material 248 described herein may be inserted or formed in a first region adjacent or proximate a second region of a semiconductor device. The first material 246/250 or only 246 shown in FIGS. 3, 4, and 6 through 10 may be disposed in the first region, e.g., by epitaxial growth, deposition, or implantation, as previously described herein. At least one region of the second material 248 may be disposed within the first material 246/250 or 246 in the first region, the second material 248 comprising a different material than the first material 246/250 or 246. The at least one region of the second material 248 increases a first stress (e.g., a tensile or compressive stress) of the first region. The increased first stress in the first region 248 created by the second material 248 increases a second stress (e.g., a compressive or tensile stress) of the second region proximate the first region.

In some embodiments, for example, the first region may be disposed proximate a first side of the second region, wherein the second region comprises a second side opposite the first side. A third region may be disposed proximate the second side of the second region. The third region includes the first material 246/250 or 246 and the at least one region of the second material 248 disposed within the first material 246/250 or 246. The at least one region of the second material 248 increases a third stress of the third region. In this embodiment, for example, the first stress of the first region and the third stress of the third region increase a second stress of the second region. The first region may comprise a source region 242, the third region may comprise a drain region 244, and the third region may comprise a channel region 226, as shown in FIGS. 3, 4, and 6 through 10, although alternatively, the first region, second region, and third region may comprise other structures that would benefit from an increase in stress in the first, second, and third regions, for example.

Embodiments of the present invention include semiconductor devices 200 and transistors 240, 264, and 284 including the first material 246/250 and second material 248 described herein. Embodiments of the present invention also include methods of fabricating the semiconductor devices 200 and transistors 240, 264, and 284, for example.

Advantages of embodiments of the invention include providing novel structures and methods for increasing the stress of source and drain regions of transistors 240, 264, and 284 and other semiconductor devices. In some embodiments, the increased tensile stress in the source and drain regions 242 and 244 causes an increase in the compressive stress of the channel region 226, improving the performance of the transistors 240, 264, and 284. The stress-enhancing structures comprised of the first material 246/250 and second material 248 in these embodiments are particularly beneficial in enhancing the performance of PMOS field effect transistors (FET's), for example.

Embodiments of the present invention may also be used to enhance the performance of NMOS FET's, for example, if the second material 248 comprises a material that increases compressive stress in the source and drain regions 242 and 244, which causes an increase in tensile stress in the channel region 246. Increasing the tensile stress in the channel region 246 of an NMOS FET improves the performance of the NMOS FET, for example.

Embodiments of the present invention advantageously enhance transistor performance and reduce or eliminate poly depletion effect (PDE) and induce a well-controlled amount of stress in the channel region 226. The channel 226 stress is increased by introducing larger or smaller element layers in the source and drain regions 242 and 244, which is also advantageous because stress relaxation is reduced or prevented. The amount of increased stress introduced in the channel region 226 is well-controlled. The size of the second material 248 may be increased or decreased, depending on the amount of stress desired in the channel region 226, for example. The stress is enhanced in accordance with embodiments of the invention by introducing more lattice mismatching, e.g., in the source and drain regions 242 and 244, by the insertion of the region or regions of second material 248.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
 a workpiece, the workpiece including a first region and a second region proximate the first region;
 a first material disposed in a portion of the first region, the first material comprising a different material than a material of the remaining portion of the first region; and
 a second material disposed within the first material in the first region, the second material comprising a different material than the first material, wherein the second material comprises a different material than the material of the remaining portion of the first region, wherein the second material increases a first stress of the first region, and wherein the second material comprises a structure comprising a horizontally-extending fin or plug disposed partially through the first region.

2. The semiconductor device according to claim 1, wherein the first stress of the first region increases a second stress of the second region proximate the first region.

3. The semiconductor device according to claim 1, wherein the first material comprises SiGe or SiC.

4. The semiconductor device according to claim 1, wherein the second material comprises Ge, InAs, InSb, InP, or C.

5. The semiconductor device according to claim 1, wherein at least some atoms of the second material are larger than atoms of the first material.

6. The semiconductor device according to claim 1, wherein the first region is proximate a first side of the second region, wherein the second region comprises a second side opposite the first side, and further comprises a third region proximate the second side of the second region, wherein the third region includes the first material and the second material disposed within the first material, wherein the second material increases a third stress of the third region, and wherein the first stress of the first region and the third stress of the third region increase a second stress of the second region.

7. The semiconductor device according to claim 2, wherein the first stress comprises tensile stress and the second stress comprises compressive stress, or wherein the first stress comprises compressive stress and the second stress comprises tensile stress.

8. A transistor, comprising:
 a channel region disposed within a semiconductor body;
 a gate dielectric disposed over the channel region;
 a gate electrode disposed over the gate dielectric;
 a source region within the semiconductor body proximate a first side of the channel region; and
 a drain region within the semiconductor body proximate a second side of the channel region, wherein the source region and the drain region each comprise a first material embedded within the semiconductor body and at least one region of a second material disposed within the first material, wherein the at least one region of the second material increases a stress of the source region and the drain region, wherein each region of the second material comprises a structure comprising:
   a first fin disposed partially or completely through the respective source region or drain region, wherein a depth of the first fin along a vertical direction is longer than a width of the first fin in a horizontal direction, wherein the horizontal direction is oriented along the source region to the drain region,
   a second fin disposed partially or completely through the respective source region or drain region, wherein a depth of the second fin along the vertical direction is shorter than the width of the first fin in the horizontal direction, and
   a liner disposed over a first portion of the first material embedded within the semiconductor body, wherein a second portion of the first material is disposed over the liner, or combinations thereof.

9. The transistor according to claim 8, wherein the first material and the second material comprise a semiconductive material, and wherein the second material comprises a different material than the first material.

10. The transistor according to claim 8, wherein the gate electrode includes the first material and the second material.

11. The transistor according to claim 8, wherein the transistor comprises a p channel metal oxide semiconductor (PMOS) field effect transistor (FET), and wherein the at least one region of the second material disposed within the first material increases a tensile stress of the source region and the drain region.

12. The transistor according to claim 8, wherein the transistor comprises an n channel metal oxide semiconductor (NMOS) field effect transistor (FET), and wherein the at least one region of the second material disposed within the first material increases a compressive stress of the source region and the drain region.

13. A semiconductor device, comprising:
 a first portion of a compound semiconductor material region disposed on sidewalls and on a bottom surface of a recess in a semiconductor body, the semiconductor body comprising a different semiconductor material than the compound semiconductor material region;
 a semiconductor liner region disposed on the sidewalls and on the bottom surface of the recess, the semiconductor liner region comprising a different semiconductor material than the compound semiconductor material region; and
 a second portion of the compound semiconductor material region disposed on sidewalls of the semiconductor liner region and on a top surface of the semiconductor liner region.

14. The semiconductor device of claim 13, wherein the semiconductor liner region comprises a structure comprising a vertically-extending layer disposed partially or completely through the compound semiconductor material region.

15. The semiconductor device of claim 13, wherein the semiconductor body and the first portion of the compound semiconductor material region are epitaxially aligned.

16. The semiconductor device of claim 13, wherein the semiconductor liner region and the compound semiconductor material region are epitaxially aligned.

17. The semiconductor device of claim 13, wherein the compound semiconductor material region comprises SiGe or SiC, and wherein the semiconductor liner region comprises Ge, InAs, InSb, InP, Si, or C.

18. The semiconductor device of claim 13, wherein the compound semiconductor material region comprises silicon germanium, and the semiconductor liner region comprises germanium.

19. The semiconductor device of claim 13, wherein the semiconductor liner region is formed within the recess in the semiconductor body.

20. The semiconductor device of claim 14, wherein the structure further comprises a horizontally-extending layer disposed partially or completely through the compound semiconductor material region, the horizontally-extending layer contacting the vertically-extending layer.

21. The semiconductor device of claim 14, wherein the semiconductor liner region comprises a horizontally-extending fin or plug embedded in the compound semiconductor material region, the horizontally-extending fin or plug contacting the vertically-extending layer.

22. A transistor comprising:
a source/drain region of the transistor comprising a compound semiconductor material region embedded in a mono-crystalline silicon region, the source/drain region further comprising:
a semiconductor material region embedded in the compound semiconductor material region, the semiconductor material region comprising at least one vertically-extending layer disposed at least partially through the source/drain region, wherein the semiconductor material region comprises molecules that are larger than molecules of the compound semiconductor material region, and wherein the semiconductor material region is disposed over a first portion of the compound semiconductor material region, wherein a second portion of the compound semiconductor material region is disposed over the semiconductor material region.

23. The transistor of claim 22, wherein the semiconductor material region comprises a horizontally-extending layer disposed partially or completely through the source/drain region, the horizontally-extending layer disposed between and contacting two vertically-extending layers.

24. The transistor of claim 22, wherein the compound semiconductor material region comprises SiGe or SiC, and wherein the semiconductor material region comprises Ge, InAs, InSb, InP, Si, or C.

25. The transistor of claim 22, wherein the compound semiconductor material region comprises silicon germanium, and the semiconductor material region comprises germanium.

26. The transistor of claim 22, wherein the transistor comprises a gate electrode, the gate electrode comprising a layer of the compound semiconductor material under a layer of the semiconductor material.

27. A transistor comprising:
a source region and a drain region of the transistor, the source region and the drain region comprising a compound semiconductor material region embedded in a mono-crystalline silicon region, the source region and the drain region further comprising:
a semiconductor material region embedded in the compound semiconductor material region, the semiconductor material region comprising at least one epitaxial layer disposed partially through the source region and the drain region, wherein the epitaxial layer comprises a thickness in a vertical direction smaller than a width along a horizontal direction, the horizontal direction being perpendicular to the vertical direction and being oriented along a direction from the source region to the drain region, wherein the semiconductor material region comprises molecules that are larger than molecules of the compound semiconductor material region.

28. The transistor of claim 27, wherein the semiconductor material region is disposed over a first portion of the compound semiconductor material region, wherein a second portion of the compound semiconductor material region is disposed over the semiconductor material region.

29. The transistor of claim 27, further comprising a gate electrode, the gate electrode comprising a first region and a second region, the first region being similar in composition and thickness to the compound semiconductor material region and the second region being similar in composition and thickness to the semiconductor material region.

* * * * *